(12) United States Patent
Lee et al.

(10) Patent No.: US 7,795,055 B2
(45) Date of Patent: Sep. 14, 2010

(54) METHOD OF MANUFACTURING LIGHT EMITTING DIODE PACKAGE

(75) Inventors: Young Il Lee, Gyunggi-do (KR); Jae Woo Joung, Gyunggi-do (KR); Joon Rak Choi, Incheon (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 260 days.

(21) Appl. No.: 12/007,417

(22) Filed: Jan. 10, 2008

(65) Prior Publication Data

US 2009/0286337 A1   Nov. 19, 2009

(30) Foreign Application Priority Data

Mar. 13, 2007   (KR) .................. 10-2007-0024368

(51) Int. Cl.
*H01L 21/00* (2006.01)
(52) U.S. Cl. ............... 438/29; 438/25; 438/26; 438/27; 438/28; 257/98; 257/99; 257/100
(58) Field of Classification Search ............ 438/25–29; 257/98–100
See application file for complete search history.

(56) References Cited

U.S. PATENT DOCUMENTS

2005/0006659 A1* 1/2005 Ng et al. .................. 257/99
2005/0167685 A1* 8/2005 Yin Chua et al. .......... 257/98
2005/0184638 A1* 8/2005 Mueller et al. ............ 313/485
2007/0001182 A1* 1/2007 Schardt et al. ............. 257/98
2007/0012940 A1* 1/2007 Suh et al. .................. 257/99
2007/0161135 A1* 7/2007 Keller et al. ............... 438/26
2009/0173957 A1* 7/2009 Brunner et al. ............ 257/98

* cited by examiner

*Primary Examiner*—Kevin M Picardat
*Assistant Examiner*—Bac H Au
(74) *Attorney, Agent, or Firm*—McDermott Will & Emery LLP

(57) ABSTRACT

There is provided a method of manufacturing a light emitting diode chip, the method including: providing a light emitting diode chip; forming a phosphor layer on a top of the light emitting diode chip; and forming phosphors of a lattice structure on the phosphor layer by an inkjet process using an ink containing phosphor powder. There is also provided A method of manufacturing a light emitting diode package, the method including: forming a phosphor layer with a predetermined thickness; forming phosphors of a lattice structure on the phosphor layer by an ink jet process using an ink containing phosphor powder; and disposing the phosphor layer having the phosphors of the lattice structure formed thereon on a top of the light emitting diode chip.

11 Claims, 7 Drawing Sheets

METHOD OF MANUFACTURING LIGHT EMITTING DIODE PACKAGE

CROSS-REFERENCE TO RELATED APPLICATIONS

This application claims the priority of Korean Patent Application No. 2007-24368 filed on Mar. 13, 2007, in the Korean Intellectual Property Office, the disclosure of which is incorporated herein by reference.

BACKGROUND OF THE INVENTION

1. Field of the Invention

The present invention relates to a method of manufacturing a light emitting diode (LED) package, more particularly, which allows phosphors of a lattice structure to be formed on a phosphor layer disposed on a light emitting surface of an LED chip of the LED package using an ink jet process, thereby increasing light emitting efficiency of the LED package and simplifying a manufacturing method thereof.

2. Description of the Related Art

A light emitting diode (LED) utilizes a phenomenon in which with a forward voltage applied to electrodes, electrons of a conduction band emit light equivalent to an energy required when transiting to recombine with holes of a valence band. The LED has various advantages over a conventional bulb to be extensively applied to electric and electronic products. That is, the LED is smaller-sized and lighter-weight, less heat-radiating, long in useful life and high in response rate.

Recently, studies have been under way to increase light emitting efficiency of an LED device. One method is to form a structure or a pattern having a predetermined period on a surface of a phosphor in order to enhance light emitting efficiency of the LED device.

That is, to form the phosphor in the LED device, mainly phosphor powder is formed into a slurry or paste to be applied on a flat surface. Here, an irradiated excited light source and light generated by subsequent excitation of the phosphor may be scattered or lost due to the phosphor powder, thereby degrading light emitting efficiency and brightness.

To overcome this problem, there have been efforts to increase light emitting efficiency by forming a lattice structure on the phosphor.

FIG. 1 is a cross-sectional view illustrating a conventional LED package disclosed in Korean Patent Publication No. 2006-0055934.

Referring to FIG. 1, the LED package includes an LED 11, a housing 14 for housing the LED chip therein and an amplifying plate 12 sealing the LED chip.

Reflective plates 14a are formed inside the housing 14 to reflect light from the LED chip 11, and the LED chip 11 is bonded to the housing by wires 18. Also, microstructures 13 are formed on one surface of the amplifying plate 12. The microstructures scatter light emitted from the LED chip to be amplified and emitted. Here, the pitch of the microstructures, depth of furrows and shapes may be varied to ensure light to be maximally refracted through the amplifying plate and thus to be maximally radiated forward.

To form the lattice structure, for example, a photo-sensitive polymer is applied on the phosphor body and then an UV is irradiated to cure a predetermined lattice structure. Then a remaining area other than the lattice structure is etched to form a three-dimensional lattice structure. Alternatively, a photolithography may be employed to form the thin film-shaped phosphor of the lattice structure.

However, when it comes to etching, it is hard to form a periodically uniform lattice structure due to problems associated with light control and resolution. Also, when the thin film-shaped phosphor is formed via photolithography, light generated inside the phosphor is trapped due to total reflection, thereby deteriorating light emitting efficiency.

SUMMARY OF THE INVENTION

An aspect of the present invention provides a method of forming a lattice structure on a phosphor layer by an ink jet process, thereby simplifying a manufacturing process and ensuring a periodically uniform and precise lattice structure.

An aspect of the present invention also provides a method of forming a lattice structure directly on a phosphor layer sheet to improve mass-producibiltiy.

According to an aspect of the present invention, there is provided a method of manufacturing a light emitting diode chip, the method including: providing a light emitting diode chip; forming a phosphor layer on a top of the light emitting diode chip; and forming phosphors of a lattice structure on the phosphor layer by an inkjet process using an ink containing phosphor powder.

The phosphor layer may be attached on the top of the light emitting diode chip, wherein the method may further include: mounting the light emitting diode chip having the phosphor layer attached on the top thereof in a housing; and molding an inner portion of the package housing with a transparent resin.

The providing a light emitting diode chip may include: mounting the light emitting diode chip in the package housing; and molding an inner portion of the package housing with a transparent resin, wherein the phosphor layer is formed on a top of the transparent resin.

The phosphors of the lattice structure may be arranged in a plurality of dots. The phosphors of the lattice structure may have a refractivity greater than a refractivity of the phosphor layer.

According to another aspect of the present invention, there is provided a method of manufacturing a light emitting diode package, the method including: forming a phosphor layer with a predetermined thickness; forming phosphors of a lattice structure on the phosphor layer by an ink jet process using an ink containing phosphor powder; and disposing the phosphor layer having the phosphors of the lattice structure formed thereon on a top of the light emitting diode chip.

The disposing the phosphor layer may include: attaching the phosphor layer having the phosphors of the lattice structure formed thereon on the top of the light emitting diode chip; mounting the light emitting diode chip having the phosphor layer attached thereon in a package housing; and molding an inner portion of the package housing with a transparent resin.

The disposing the phosphor layer may include: mounting the light emitting diode chip in the package housing; molding an inner portion of the package housing with a transparent resin; and attaching the phosphor layer having the phosphors of the lattice structure formed thereon on a top of the transparent resin.

The phosphors of the lattice structure may be formed on a sheet of the phosphor layer, wherein the method may further include: cutting the sheet of the phosphor layer having the phosphors of the lattice structure into unit chips before the disposing the phosphor layer having the phosphors of the lattice structure formed thereon.

The phosphors of the lattice structure may be arranged in a plurality of dots. The phosphors of the lattice structure may have a refractivity greater than a refractivity of the phosphor layer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

FIG. 2 is a flow chart illustrating a method of manufacturing a light emitting diode (LED) package according to an exemplary embodiment of the invention.

Figure 1:
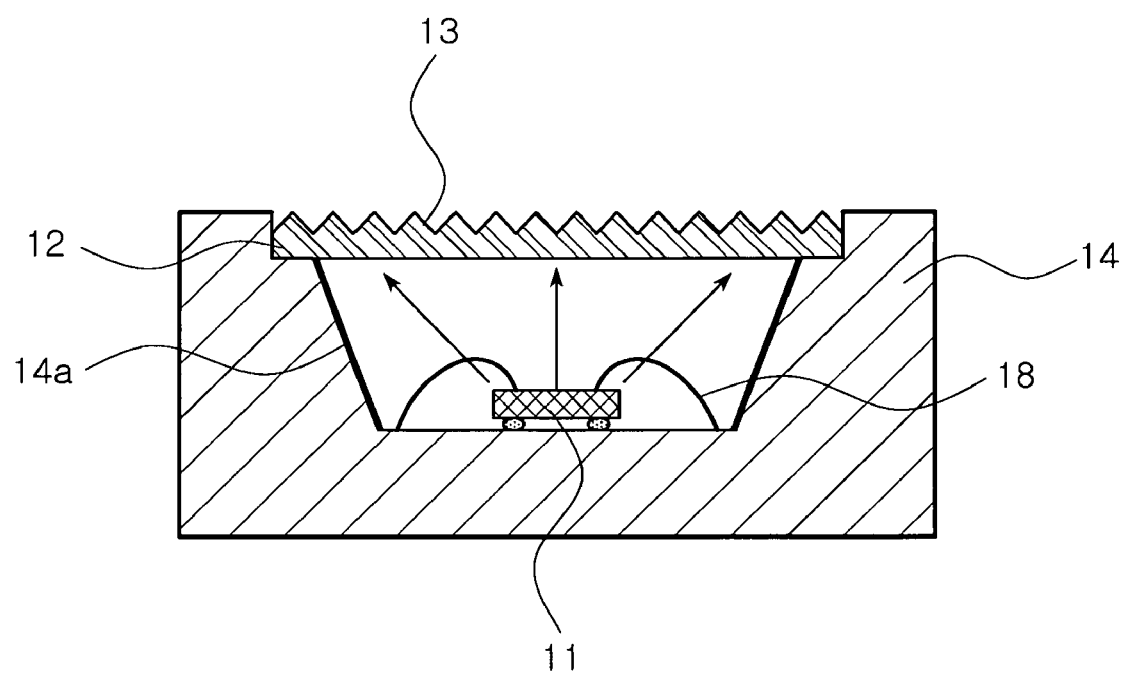
FIG. 1 is a cross-sectional view illustrating a conventional light emitting diode package.
Figure 2A:
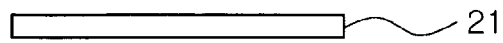
FIGS. 2A to 2E are a flow chart illustrating a method of manufacturing a light emitting diode package according to an exemplary embodiment of the invention.

As shown in FIG. 2A, first, an LED chip 21 is provided.

The present embodiment employs an LED chip cut into unit chips at a wafer level.

Figure 2B:
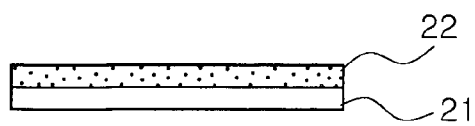

As shown in FIG. 2B, a phosphor layer 22 is formed on the LED chip 21.

The phosphor layer 22 may be formed by applying a paste having dispersible phosphor powder of nano particles mixed in a transparent polymer resin on the LED chip 21 and curing the paste. The transparent polymer resin may utilize a curable resin or an acrylic resin. Particularly, the transparent polymer may adopt an epoxy polymer resin or a silicon polymer resin.

Figure 2C:
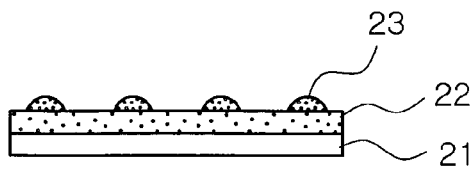

As shown in FIG. 2C, phosphors 23 of a lattice structure are formed on the phosphor layer 22.

In the present embodiment, the lattice-structured phosphors 23 are formed by an ink jet process. The lattice-structured phosphors define protrusions on the phosphor layer 22, thereby forming microstructures on the phosphor layer 22.

In the present embodiment, a plurality of dots 23 protruded from the phosphor layer 22 define the lattice structure.

With the lattice-structured phosphors 23 formed, light generated inside the phosphor layer 22 can be extracted forward through the lattice-structured phosphors 23 by bragg scattering. This light extraction mechanism resulting from the bragg scattering induced by the lattice structure is governed by a height or period of the lattice structure.

As in the present embodiment, the ink jet process, when employed to form the lattice structure, allows control of an amount and size of droplets ejected according to characteristics of a head used. Accordingly, a height, width and period of the lattice structure can be adjusted freely. Moreover, the ink jet process precludes a need for a conventional exposure process requiring a mask, but enables the lattice structure to be formed by directly printing a phosphor-containing ink. This simplifies a process significantly and increases economic efficiency due to a minimal amount of phosphors used.

The ink used in the ink jet process may be formed by mixing dispersible phosphor powder of nano particles, a solvent and curable polymer. The ink may have a proper viscosity to be ejected by a nozzle and the lattice-structured phosphors can be adjusted in height depending on the viscosity.

In addition, the lattice-structured phosphors 23 may be made of a material having a refractivity identical to or higher than the underlying phosphor layer 22 to eliminate total reflection effects.

Figure 2D:
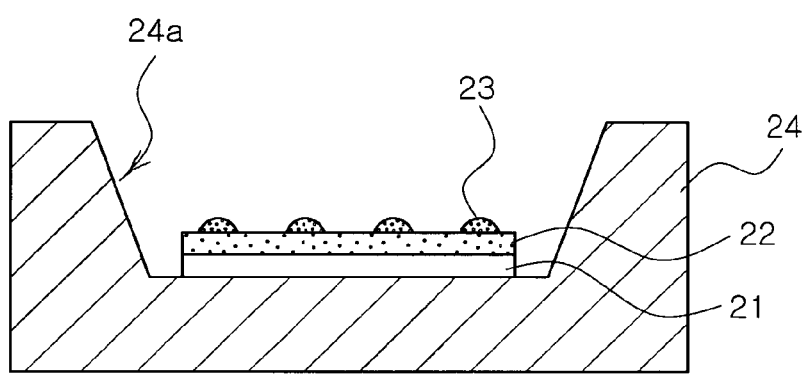

Referring to FIG. 2D, the LED chip 21 having the phosphor layer 22 attached thereon is mounted in a package housing 24.

A metal terminal (not shown) is disposed in the package housing 24 to have the LED chip 21 mounted thereon. The metal terminal and the LED chip 21 may be electrically connected together by wire bonding and flip chip bonding.

In FIG. 2D, a connection between the LED chip and the package housing is not illustrated specifically. But LED chip mounted in the package housing means the LED chip electrically connected to the terminal in the package housing.

Inside the package housing 24, reflective plates 24a are formed in the shape of a circular truncated cone to reflect light generated from the LED chip forward. The reflective plates 24a may be formed by thinly coating Al, Ag, Cr, Ni or Ti on a surface of a thermo-setting polymer resin or a metal plate.

Figure 2E:
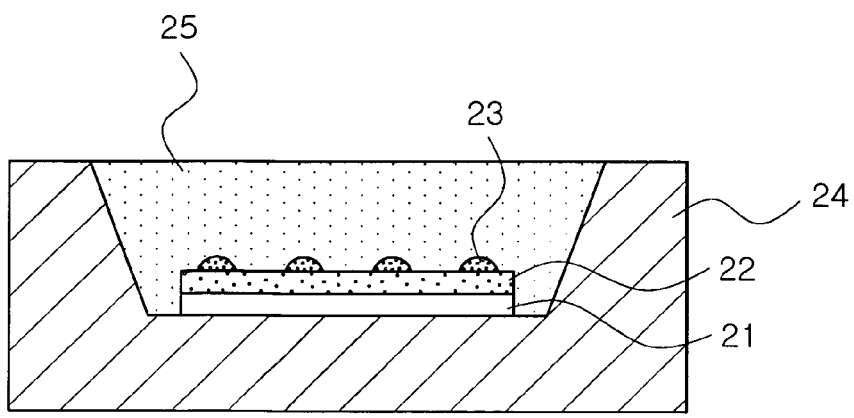

Referring to FIG. 2E, an inner portion of the package housing 24 is molded with a transparent resin 25.

The transparent resin 25 protects the LED chip mounted in the housing 24 from external environment. Also, the resin 25 may be phosphor-containing. The transparent resin may utilize a transparent polymer resin and particularly an epoxy resin or a silicon resin.

FIGS. 3A to 3D are a flow chart illustrating a method of manufacturing an LED package according to another embodiment of the invention.

Figure 3A:
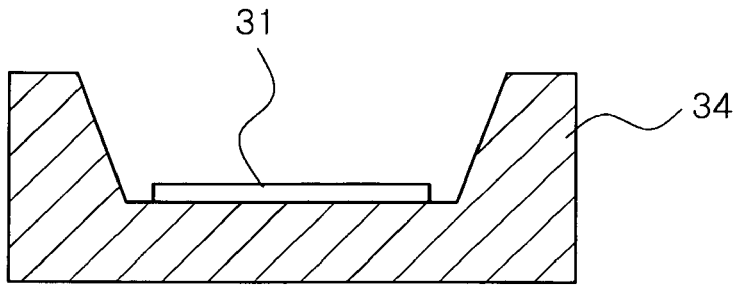
FIGS. 3A to 3D are a flow chart illustrating a method of manufacturing a light emitting diode package according to another exemplary embodiment of the invention.

Referring to FIG. 3A, an LED chip 31 is mounted in a package housing 34.

The LED chip 31 mounted in the package housing 34 means the LED chip 31 electrically connected to a terminal of the package housing 34 by wire bonding or flip chip bonding.

Figure 3B:
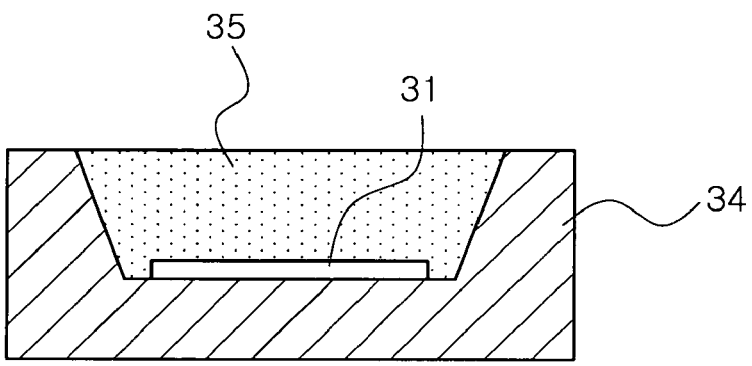

Referring to FIG. 3B, an inner portion of the housing package 34 is molded with a transparent resin 35.

The transparent resin 35 may utilize a transparent polymer resin, and particularly, an epoxy resin or a silicon resin.

Figure 3C:
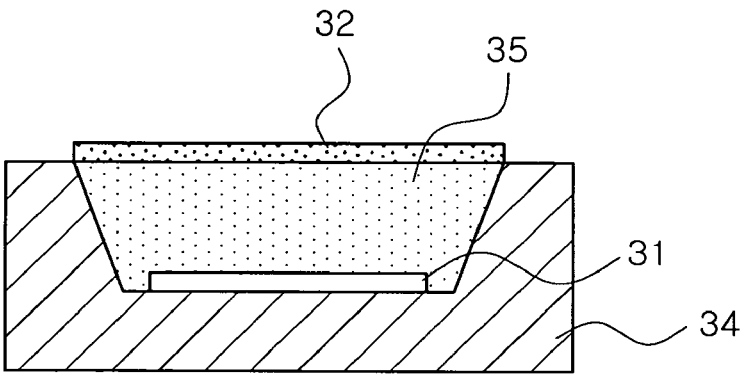

As shown in FIG. 3C, a phosphor layer is formed on the transparent resin 35.

The phosphor layer 32 may be formed by applying a phosphor paste having phosphor powder and an epoxy resin mixed therein on a transparent resin and curing the phosphor paste.

Figure 3D:
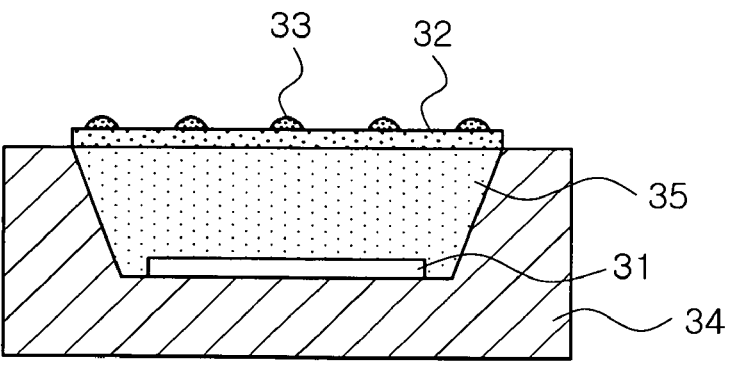

Referring to FIG. 3D, phosphors 33 are formed on the phosphor layer 32 by an ink jet process.

Here, the procedure of forming the phosphors of a lattice structure 33 can be performed in the same manner as the procedure shown in FIG. 2C.

Figure 4A:
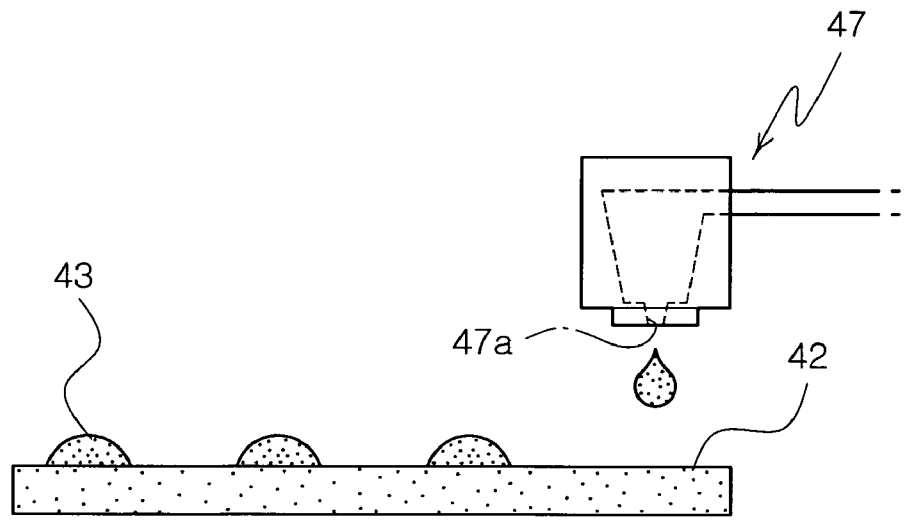
FIG. 4A is a cross-sectional view and FIG. 4B is a perspective view illustrating a method of forming a phosphor of a lattice structure on a phosphor layer by an ink jet process, respectively according to an exemplary embodiment of the invention.
Figure 4B:
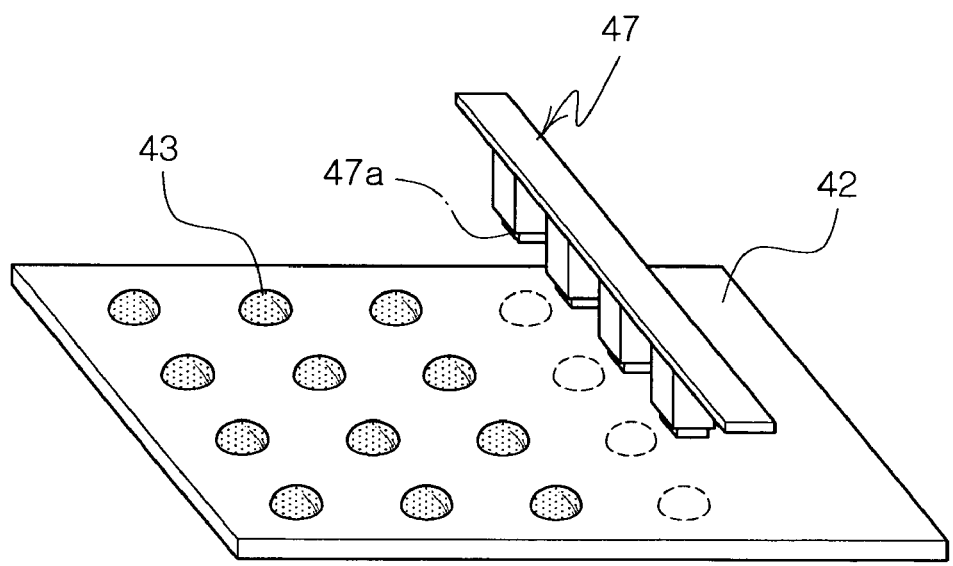

FIG. 4A is a cross-sectional view and FIG. 4B is a perspective view illustrating a method of manufacturing phosphors of a lattice structure on a phosphor layer by an ink jet process as shown in the embodiments of FIGS. 2 and 3.

Referring to FIGS. 4A and 4B, phosphors 43 of a lattice structure are formed using an ink jet nozzle 47 on a phosphor layer 42 of a chip size formed on an LED chip or a transparent resin.

In the present embodiment, the ink jet nozzle 47 is made to eject droplet discontinuously to allow a plurality of protruded dots to be arranged in a lattice structure. However, the configuration and characteristics of the nozzle may be varied. That is, the droplets may be ejected continuously from the nozzle to form the continuously protruded dots of phosphors having a lattice structure.

The ink for use in the ink jet process may utilize phosphor powder, a solvent and a polymer resin. The ink may have a viscosity varied by adjusting a ratio of the polymer resin to the solvent, which are mixed together. With the viscosity of the ink varied, the phosphors of the lattice structure can be adjusted in height and area. Also, the size and height of the dots defining the lattice-structured phosphors can be adjusted basically by varying a nozzle size of a head, a driving voltage and a driving waveform, thereby producing the lattice-structure phosphors of a desired size and shape.

As described above, the ink jet process, when used in forming the lattice-structured phosphors allows the microstructures to be more easily adjusted in shape and spacing than conventional etching or photolithography. Also, the ink jet process enables direct printing on the phosphors, thereby simplifying an overall process.

Figure 5A:
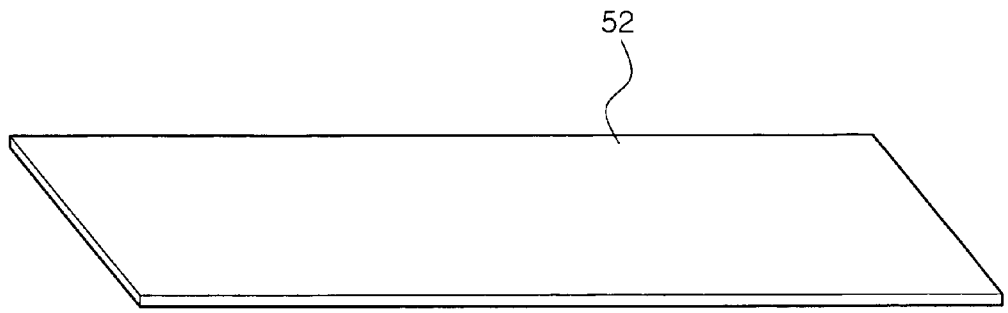
FIGS. 5A to 5C are a flow chart illustrating a method of forming a phosphor layer having a phosphor of a lattice structure thereon according to another embodiment of the invention.
Figure 5B:
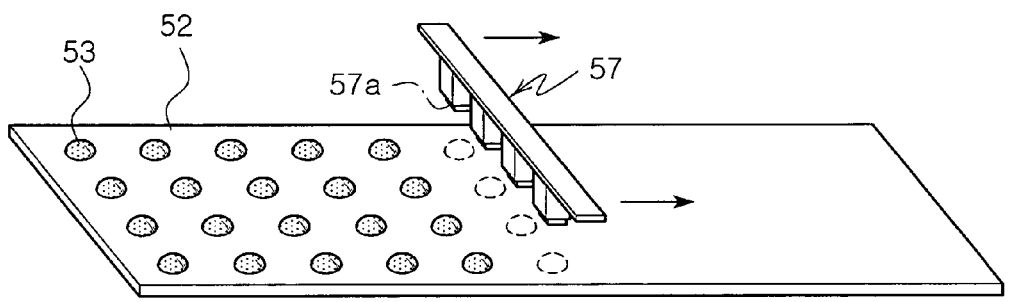
Figure 5C:
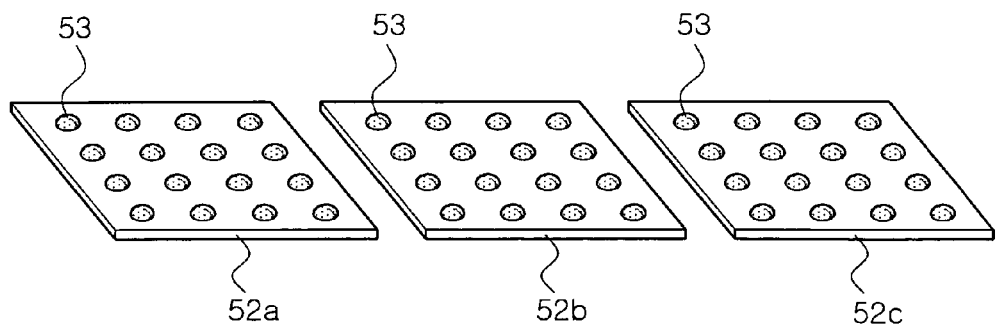

FIGS. 5A to 5C are a flow chart illustrating a method of forming a phosphor layer having phosphors of a lattice structure formed thereon according to another exemplary embodiment of the invention.

Referring to FIG. 5A, a phosphor layer sheet 52 is formed. The phosphor layer sheet 52 is formed to a predetermined thickness by curing a transparent resin having phosphor powder mixed therein.

As shown in FIG. 5B, phosphors 53 are formed on the phosphor sheet 52 by an ink jet process.

According to the present embodiment, the ink jet nozzle 57 is moved in a direction indicated with arrows along the phosphor sheet 52. In the present embodiment, the dot-shaped phosphors of a lattice structure are formed but the lattice-structure phosphors can be formed without interruption by adjusting characteristics of the ink jet nozzle 57.

Referring to FIG. 5C, the phosphor sheet 52 having the lattice-structured phosphors 53 thereon is cut into unit chips 52a, 52b, and 52c.

As in the present embodiment, the phosphors of the lattice structure are formed at a time on the phosphor layer sheet, and then cut into unit chips of a desired size. This facilitates an overall process over a case where the ink jet process is performed on respective unit LED chips or an LED package.

Figure 6A:
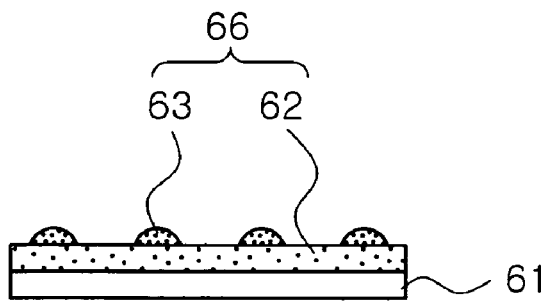
FIGS. 6A to 6C are a flow chart illustrating a method of manufacturing an LED package according to an exemplary embodiment of the invention, which adopts a phosphor layer having a phosphor of a lattice structure formed thereon by the method shown in FIG. 5.
Figure 6B:
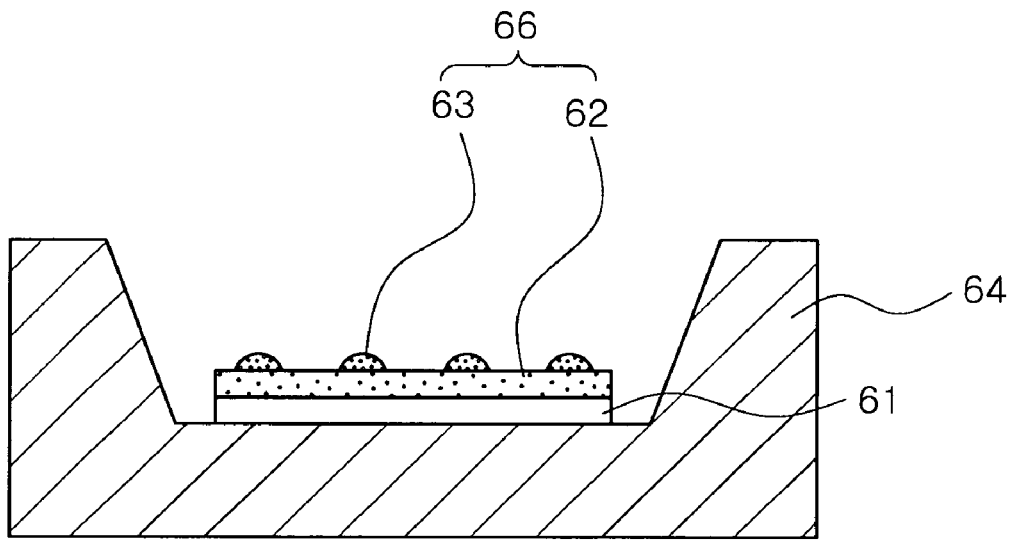
Figure 6C:
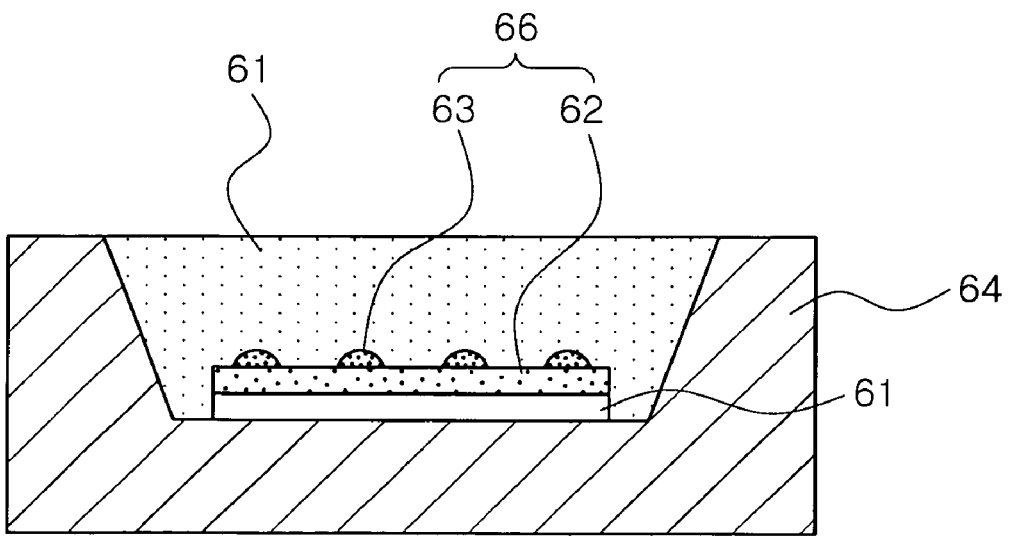

FIGS. 6A to 6C are a flow chart illustrating a method of manufacturing an LED package according to an exemplary embodiment of the invention, which adopts a phosphor layer having phosphors of a lattice structure formed thereon by the method shown in FIG. 5.

Referring to FIG. 6A, a phosphor layer 66 having phosphors of a lattice structure formed thereon is bonded to an LED chip 61.

Here, the phosphor layer 66 having the lattice-structured phosphors formed thereon is the unit chip phosphor layer manufactured by the method shown in FIGS. 5A to 5C. In the present embodiment, unlike the embodiment of FIG. 2, the phosphor layer 66 having the lattice-structured phosphors formed thereon is integrally fabricated on a sheet and cut into unit chips to be bonded onto the LED chip. This accordingly simplifies a manufacturing process.

Referring to FIG. 6B, the LED chip 61 where the phosphor layer 66 having the lattice-structured phosphors are attached is mounted in a package housing 64. Referring to FIG. 6C, an inner portion of the package housing 64 is molded with a transparent resin.

FIGS. 6B and 6C of the present embodiment are performed in an identical process to FIGS. 2D and 2E.

Figure 7A:
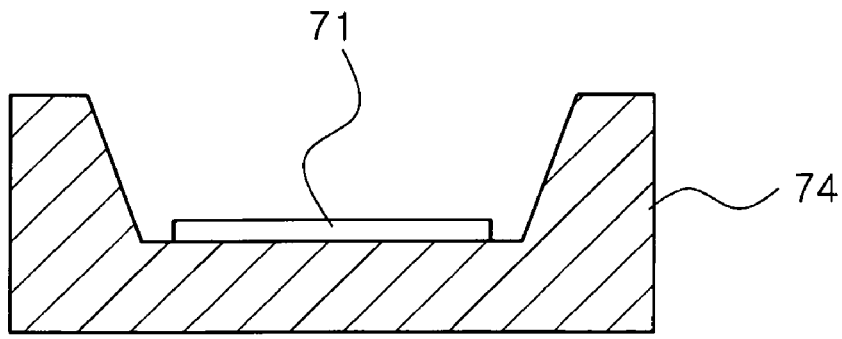
FIGS. 7A to 7C are a flow chart illustrating a method of manufacturing an LED package according to another exemplary embodiment of the invention, which adopts a phosphor layer having a phosphor of a lattice structure formed thereon by the method shown in FIG. 5.
Figure 7B:
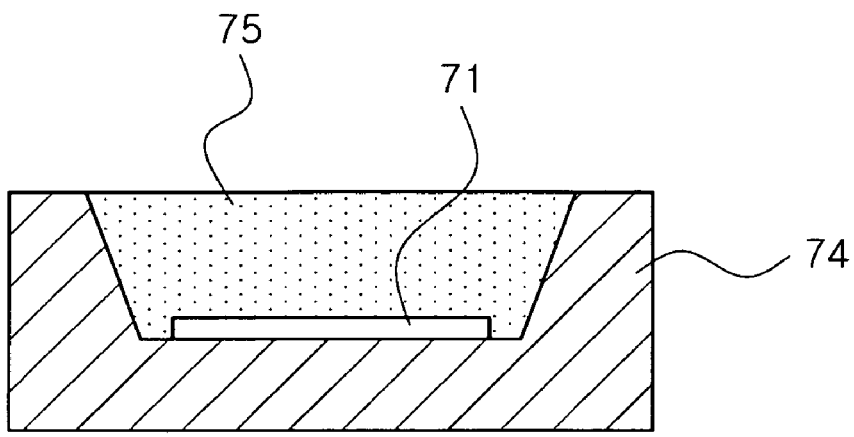
Figure 7C:
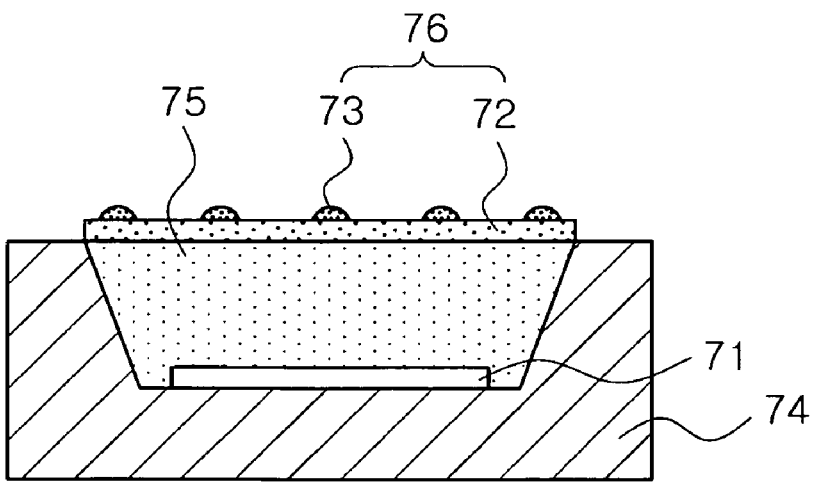

FIGS. 7A to 7C are a flow chart illustrating a method of manufacturing an LED package according to another embodiment of the invention.

Referring to FIG. 7A, an LED chip 71 is mounted in a package housing 74 and referring to FIG. 7B, an inner portion of the package housing 74 is molded with a transparent resin 75.

In the present embodiment, FIGS. 7A and 7B of the present embodiment are performed in an identical process to FIGS. 3A and 3B.

As shown in FIG. 7C, a phosphor layer 76 having phosphors of a lattice structure formed thereon is bonded to the transparent resin 75.

Here, the phosphor layer 76 having the lattice-structured phosphors formed thereon is a unit chip phosphor layer fabricated by processes of FIGS. 5A to 5C. In the present embodiment, unlike FIG. 3, the phosphor layer 76 having the lattice-structured phosphors formed thereon is integrally fabricated and then bonded onto the LED chip, thereby simplifying a manufacturing process.

As described above, the present invention is not limited to the aforementioned embodiments and drawings attached. That is, a type of a phosphor-containing ink used in the ink jet process and shape of the lattice-structured phosphors may be varied.

As set forth above, according to exemplary embodiments of the invention, an ink jet method is employed to form lattice-structured phosphors on a phosphor layer. This realizes a periodically uniform and more precise lattice structure and simplifies a process of manufacturing the lattice-structured phosphors.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a light emitting diode chip, the method comprising:
    providing a light emitting diode chip;
    forming a phosphor layer on a top of the light emitting diode chip; and
    forming phosphors of a lattice structure including an uneven surface on the phosphor layer by an inkjet process using an ink containing phosphor powder.

2. The method of claim 1, wherein the phosphor layer is attached on the top of the light emitting diode chip,
    wherein the method further comprises:
    mounting the light emitting diode chip having the phosphor layer attached on the top thereof in a housing; and
    molding an inner portion of the package housing with a transparent resin.

3. The method of claim 1, wherein the providing a light emitting diode chip comprises:
   mounting the light emitting diode chip in the package housing; and
   molding an inner portion of the package housing with a transparent resin,
   wherein the phosphor layer is formed on a top of the transparent resin.

4. The method of claim 1, wherein the phosphors of the lattice structure are arranged in a plurality of dots.

5. The method of claim 1, wherein the phosphors of the lattice structure have a refractivity greater than a refractivity of the phosphor layer.

6. A method of manufacturing a light emitting diode package, the method comprising:
   forming a phosphor layer with a predetermined thickness;
   forming phosphors of a lattice structure including an uneven surface on the phosphor layer by an ink jet process using an ink containing phosphor powder; and
   disposing the phosphor layer having the phosphors of the lattice structure formed thereon on a top of a light emitting diode chip.

7. The method of claim 6, wherein the disposing the phosphor layer comprises:
   attaching the phosphor layer having the phosphors of the lattice structure formed thereon on the top of the light emitting diode chip;
   mounting the light emitting diode chip having the phosphor layer attached thereon in a package housing; and
   molding an inner portion of the package housing with a transparent resin.

8. The method of claim 6, wherein the disposing the phosphor layer comprises:
   mounting the light emitting diode chip in the package housing;
   molding an inner portion of the package housing with a transparent resin; and
   attaching the phosphor layer having the phosphors of the lattice structure formed thereon on a top of the transparent resin.

9. The method of claim 6, wherein the phosphors of the lattice structure are formed on a sheet of the phosphor layer, wherein the method further comprises:
   cutting the sheet of the phosphor layer having the phosphors of the lattice structure into unit chips before the disposing the phosphor layer having the phosphors of the lattice structure formed thereon.

10. The method of claim 6, wherein the phosphors of the lattice structure are arranged in a plurality of dots.

11. The method of claim 6, wherein the phosphors of the lattice structure have a refractivity greater than a refractivity of the phosphor layer.

* * * * *